United States Patent [19]

Stückler

[11] Patent Number: 4,466,530
[45] Date of Patent: Aug. 21, 1984

[54] FEED MECHANISM FOR PARTS

[76] Inventor: Gerd Stückler, Birkenweg 18, D-8151 Osterwarngau, Fed. Rep. of Germany

[21] Appl. No.: 359,166

[22] Filed: Mar. 17, 1982

[30] Foreign Application Priority Data

Apr. 7, 1981 [DE] Fed. Rep. of Germany ....... 3114032

[51] Int. Cl.³ ...................... H05K 13/02; B65G 35/06
[52] U.S. Cl. .................................. 198/472; 198/580; 198/795
[58] Field of Search ............... 198/472, 795, 799, 800, 198/580; 250/328

[56] References Cited

U.S. PATENT DOCUMENTS 3,418,084 12/1968 Allington ........................ 198/472 X
4,029,961 6/1977 Cohr et al. ...................... 198/472 X

FOREIGN PATENT DOCUMENTS 2856109 3/1981 Fed. Rep. of Germany .

Primary Examiner—Jeffrey V. Nase
Attorney, Agent, or Firm—Toren, McGeady and Stanger

[57] ABSTRACT

In a feed mechanism for parts comprising a plurality of oblong pallets (30) provided with vessels (32) for receiving parts, a guide system conducting along a looped path (36) according to FIG. 2 the pallets (30) which are essentially parallel to one another, the looped path (36) composed of two moving paths (38) which are located parallel next to one another and approximately perpendicular to the longitudinal direction of the pallets and two transition paths (40) which connect the moving paths, and a drive for moving the pallets along the looped path (36), the drive having a drive element (72, 74) each in the regions of the two transition paths (40), it is proposed that deflection paths (39) having engagement and disengagement position for the pallets are provided in the looped path (36) between the moving paths (38) and the transition paths (40), wherein a pallets located in one of the engagement or disengagement positions is displaced relative to its position in the closest transition path by a distance which is less than the width of a pallets, but is not vanishing, toward the respective other transition path. In this manner, a substantially simplified drive mechanism is obtained because, in addition to these drive elements, no further drive elements acting on the pallets are required.

23 Claims, 9 Drawing Figures

4,466,530

FEED MECHANISM FOR PARTS

The invention relates to a feed mechanism for parts, particularly for an assembly table for printed circuit boards, comprising a plurality of oblong pallets provided with vessels for receiving parts and possibly constructed in one piece with the vessels, a guide system conducting along a looped path the pallets which are essentially parallel to one another, the looped composed of two moving paths which are located parallel next to one another and are approximately perpendicular to the longitudinal direction of the pallets and two transition paths connecting the two moving paths, and a drive for moving the pallets along the looped path, the drive having a drive element each in the regions of the two transition paths, each drive element acting on the respective pallet located in the transition path, wherein several pallets are arranged in each moving path with mutual lateral contact and are moved jointly step-by-step by the width of one pallet, while the pallets of the respectively other moving path are moved in the opposite direction, and wherein a pallet can be moved step-by-step in each transition path by means of the respective drive element, possibly by a distance corresponding to the width of a compartment of the vessel of the pallet, while the pallet in the respectively other transition path is moved in the opposite direction and the pallets located in the moving paths stand still in the normal position.

A feed mechanism for parts of this type is known is from West German Auslegeschrift No. 2,716,548. That arrangement offers the possibility of accommodating a plurality of vessels for receiving parts in one plane (for example, within the interior of the table plate of an assembly table) because the surface area available for the oblong pallets placed next to one another laterally in the moving paths is utilized very well. By a cyclical movement of the pallets along the looped path, it is possible to move any desired pallet to a place of removal, for example, in the region of the middle of the length of a transition path. Moreover, the pallet can be moved step-by-step in accordance with the width of a compartment of the vessel. When two pallets are moved along the transition paths, the pallets in the moving paths must be at a standstill in the normal positions, since they otherwise would enter into the paths for moving the two pallets. Conversely, when the pallets in the moving paths are moved by the width of a pallet, no movement of the pallets in the transition paths takes place. In the known feed mechanism for parts, this alternating drive of the pallets in the moving paths and in the transition paths is achieved by a dual drive. The two drive elements serving to shift the pallets along the transition paths are formed by a pull chain which acts on the outer longitudinal sides of the pallets. Serving to shift the pallets within the moving paths by the width of a pallet are two drive cranks each which are arranged at an end each of the two moving paths and act on webs formed at the bottom sides of the pallets. This known drive is mechanically complicated because altogether four drive cranks and the pull chain must be driven in an exactly synchronized manner. An error in the synchronization can lead to damage; for example, when the pull chain is stopped too late, the pallets taken along by the chain hit hard against the lateral edges of the moving paths.

In view of the above, it is the object of the invention to provide a feed mechanism for parts of the above-mentioned type with a simplified construction of the drive.

This object is met by providing preferably slanting or rounded deflection paths in the looped path between the moving paths and the transition paths, the deflection paths being constructed in such a way that the pallets reach engagement with the respective drive element when they reach a predetermined engagement position within the respective deflection path during their movement from a moving path to a transition path and remain in engagement with the drive element until they reach a predetermined disengagement position within the respective deflection path during their movement from the transition path to a moving path, wherein a pallet located in one of the engagement or disengagement positions is displaced relative to its position at the closest end of the next following transition path by a distance which is less than the width of a pallet, but is not vanishing, toward the respective other transition path. In addition to the two drive elements, no further drive parts are required which act on the pallets in the moving paths and are alternately driven by the drive elements. This is because if one pallet is moved by one of the drive elements to the end of a transition path and is subsequently moved into the deflection path up to the disengagement position, the pallel is shifted, as are the preceding pallets of the following moving path in the direction toward the other transition path. The pallet movement cycle is continued thereby that the pallet at the opposite end of the moving path referred to is pushed during this shifting movement to such an extent into the subsequent deflection path that it reaches engagement with the drive element located there. This pallet can then be moved by the drive element along this transition path. The fact that the pallets are disengaged within the deflection paths prior to reaching the next following normal position which is spaced exactly one width of a pallet from the transition path in the direction of the pallet width ensures that the pallet moved subsequently into the normal position is disengaged from this drive element and, therefore, does not impair its feed movement during the shifting of the next following pallet along the transition path.

It is suggested that the distance of displacement seen in the direction of the palett width of a pallet moved from a transition path into one of the disengagement positions is greater than the distance of displacement seen in the direction of the palett width of a pallet moved from a normal position at the end of a moving path into one of the engagement positions. An exact synchronization of the palett movement is achieved as a result of this measure. This is because if a pallet driven by one of the drive elements is just about to approach a disengagement position, the next following pallet reaches engagement with the drive element before the preceding pallet is disengaged. Accordingly, the times for driving pallets which follow one another overlap.

In order to prevent a pallet which has not yet been engaged from being driven prematurely by the drive element, for example, due to vibrations, it is suggested that the end regions of the pallets and possibly the deflection paths are constructed in such a way that, when a pallet immediately approaches an engagement position in the direction toward the closest transition path, this pallet either rests against the preceding pallet driven by the closest drive element preferably over slanting pallet corner regions of both pallets or follows the preceding pallet with a slight distance play, so that an automatic movement of the subsequent pallet into the engagement position is prevented by the preceding pallet.

The driveless movement of a pallet from the disengagement position into the next following normal position can be effected by means of a bistable element, for example, an auxiliary gear which is prestressed in a position of rotation and acts on the pallet and which has the tendency to move the pallet into the normal position. However, such an element can be be omitted if, as proposed, the end regions of the pallets and possibly the deflection paths are constructed in such a way that, when a pallet is moved along a deflection path toward the following moving path, at the latest after reaching the disengagement position, the subsequent pallet begins to push the preceding pallet into the next following normal position, preferably over slanting pallet corner regions of both pallets. Accordingly, the movement of pallets which follow one another is synchronized in such a manner that the pallets follow one another immediately during their travel along the looped path; this is effected in such a way that a pallet located in the driveless and, therefore, critical region between a disengagement position or a disengagement position and the next following normal position is reliably brought into the normal position or into engagement with the drive element, depending on the direction of movement, it being prevented that the pallet unintentionally reaches engagement with the drive element, for example, due to vibrations.

In order to achieve a relatively gentle collision of the pallets in order to protect the material thereof when the slanting pallet corner regions meet initially, and a subsequent fast movement of the preceding pallet, it is proposed that the pallet corner region is formed by a slanting portion which starts at the pallet side surface and continues into the pallet end surface over a rounded portion.

While in the above-mentioned, known feed mechanism for parts a reversal of the movement is not possible, this can be easily achieved in the feed mechanism for parts in accordance with the invention thereby that the disengagement position is essentially identical to the engagement position and, possibly, is located closer to the moving path than to the transition path, as seen in the direction of the pallet width. The asymmetrical position ensures that a pallet is disengaged at a later point in time than the engagement of the next following pallet.

Furthermore, it is proposed that the pallets are each constructed with an oblong drive projection extending in longitudinal direction of the pallet and having an engagement surface for the drive elements which travels in the moving path, and that, upon a movement of the pallets along this transition path, the drive elements arranged in the region of the middle of the length of the respective transition path roll on that side surface of the drive projection which faces the center point of the looped path.

The drive projection can be constructed with a circumferential toothing which may preferably consist of two parallel, essentially straight longitudinal toothings and two end toothings which connect the longitudinal toothings and preferably describe a semicircular arc or form an acute angle.

However, the drive projection can also be constructed differently, preferably as a row of pins.

Chains or toothed belts can be used as drive elements which are guided around deflection rollers in the region of the middle of the lengths of the transition paths. However, in a particularly simple embodiment, the two drive elements are formed by two synchronously driven gear wheels. If the two gear wheels are connected to one another by means of toothed belts, only one motor drive is required.

In the case that the pallets rest on an essentially plane base, it is proposed that two loop-shaped groove paths are provided in the base which loop-shaped groove paths are arranged offset relative to one another and are each constructed with a guide groove whose shapes each correspond essentially to the shape of the looped path, and that each pallet is provided with two guide elements which each engage in a guide groove assigned to it. As a result, the pallets are guided along the looped path in a simple and reliable manner. A preferred embodiment is characterized in that the guide grooves intersect at an angle which has such a magnitude that an engagement of one guide element into the guide groove assigned to the other guide element is essentially excluded during the operation. The angle preferably is about 70°.

In order to ensure a quiet run of the pallets and to prevent the possibility of an incorrect engagement, it is proposed that each guide element has a pivotable guide member which is inserted into the guide groove.

In order to prevent a lifting of the pallets from the base, it is proposed that the guide grooves are undercut.

In order to ensure an especially smooth run of the pallets, it is proposed that the guide elements are constructed with rotatably mounted guide rollers whose diameter is slightly smaller than the width of the guide groove or the groove opening of the undercut guide groove, and that the guide rollers engage in the guide groove or the groove opening.

In the following, embodiments of the invention shall be explained with the aid of the drawing. In the drawing.

Figure 1:
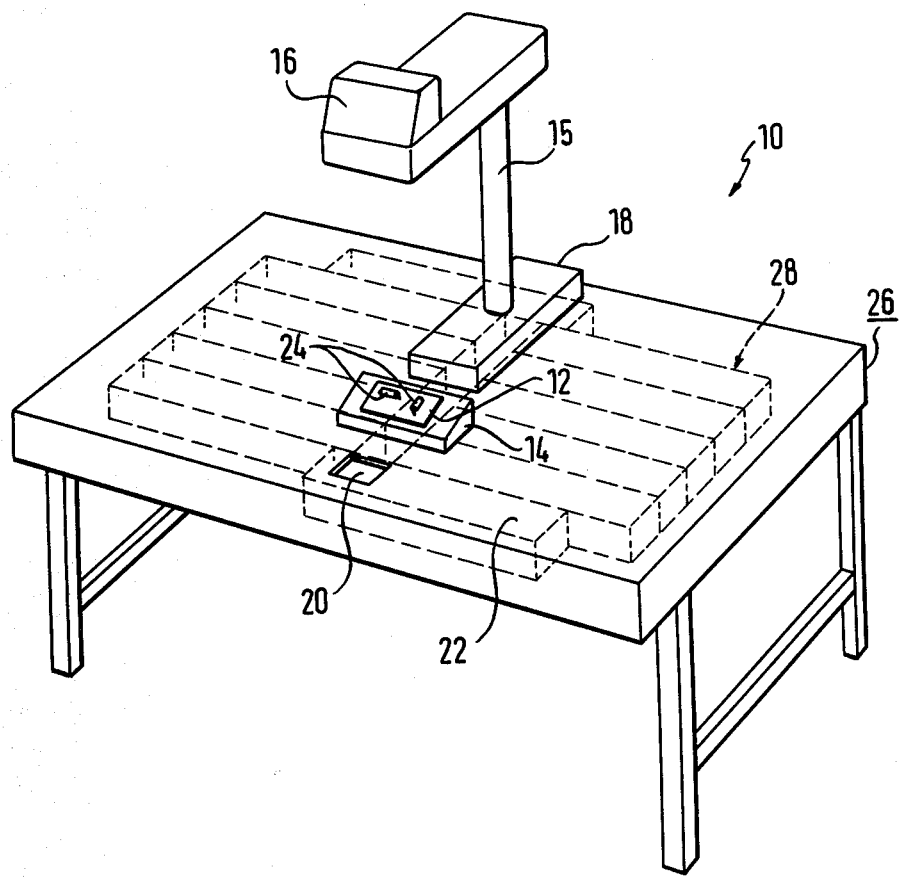
FIG. 1 is a perspective, schematic representation of an assembly table receiving a feed mechanism for parts in accordance with the invention.

The assembly table 10 illustrated in FIG. 1 serves for the assembly of a printed circuit board 12 which is placed on a schematically illustrated holder 14. A luminous head 16 serving for the indication of the respective location of assembly is mounted on the upper side of the assembly 10 over a support arm 15 and a base plate 18. The components intended for the next assembly step for the printed circuit board 12 can be removed from a removal opening 20 in the upper cover plate 22 of the assembly table 10. As indicated in FIG. 1, two such components 24 have already been mounted on the printed circuit board.

Figure 2:
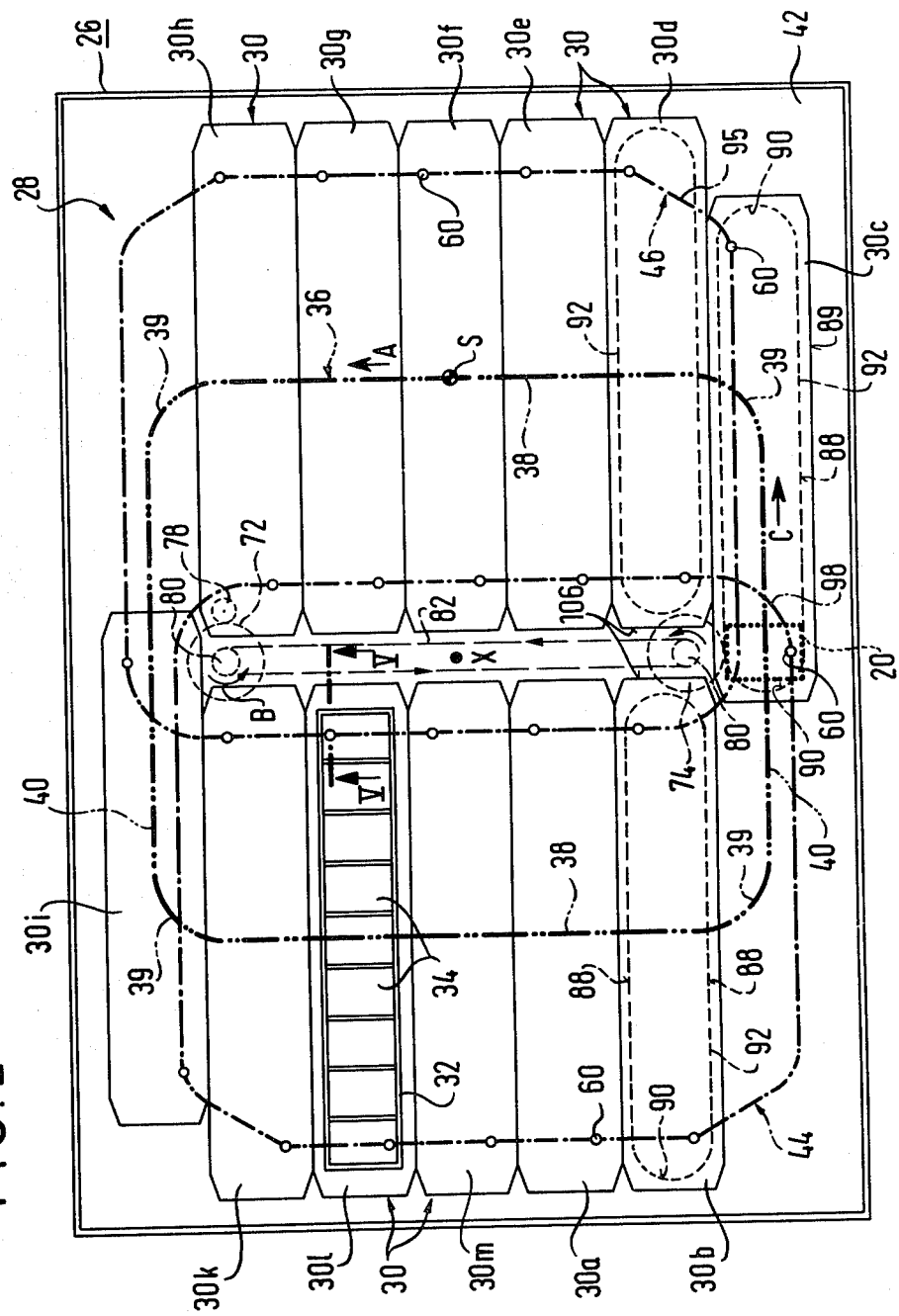
FIG. 2 is a top view of the assembly table according to FIG. 1, with the cover plate having been removed.

The components are supplied as they are needed by means of a feed mechanism 28 arranged within the actual table plate 26, as it is illustrated in FIG. 1 roughly schematically in broken lines. FIG. 2 shows the construction of the feed mechanism 28. The removal opening 20 located above the feed mechanism 28 is indicated in a dotted line. The feed mechanism 28 includes a plurality of pallets 30 (as illustrated in the drawing, twelve pallets) which support exchangeable receiving vessels 32. As can seen from FIG. 4, each pallet 30 is provided with a continuous receiving vessel 32 which is divided into a plurality of compartments 34 (as illustrated in the drawing, nine compartments). For simplifying the illustration, only one pallet 30 is provided with such a receiving vessel 32 in FIG. 2. Instead of a single continuous receiving vessel 32, it is also possible to place a plurality of individual receiving vessels next to one another on the pallets 30. The dimension of the openings of the compartments 34 corresponds to the dimensions of the removal opening 20.

During operation, the pallets 30 are guided along an approximately rectangular looped path. The curve 36 indicated in FIG. 1 with a dot-dot-dash line and describing the path of the center of gravity S of the pallets 30, can be considered equivalent to the looped path. The portions of the looped path 36 which extend from top to bottom as seen in FIG. 2 shall be designated moving paths 38 and the portions extending from right to left shall be designated transition paths 40. The corner regions of the looped path 36 are rounded and are called deflection paths 39.

In the moving paths 38, the pallets 30 rest against one another and are moved jointly. In the transition paths, on the other hand, a pallet is moved from one moving path 38 to the other. The shifting movements in the two transition paths 40 are in opposite directions, as are those in the moving paths 38. As shall be described in the following, the looped path 36 can be traveled by the pallet 30 alternately in one direction as well as in the other direction.

Figure 3A:
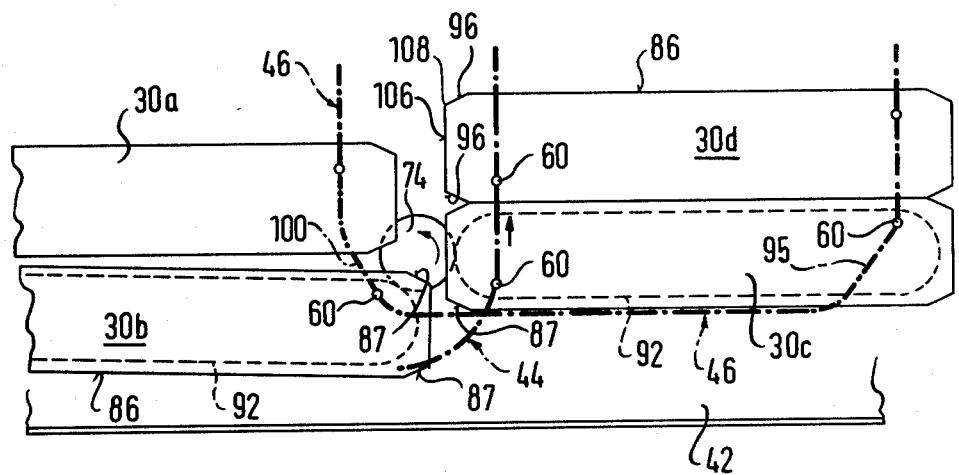
FIGS. 3A to 3C show details of the arrangement according to FIG. 2 during different phases of movement of the feed mechanism.
Figure 3C:
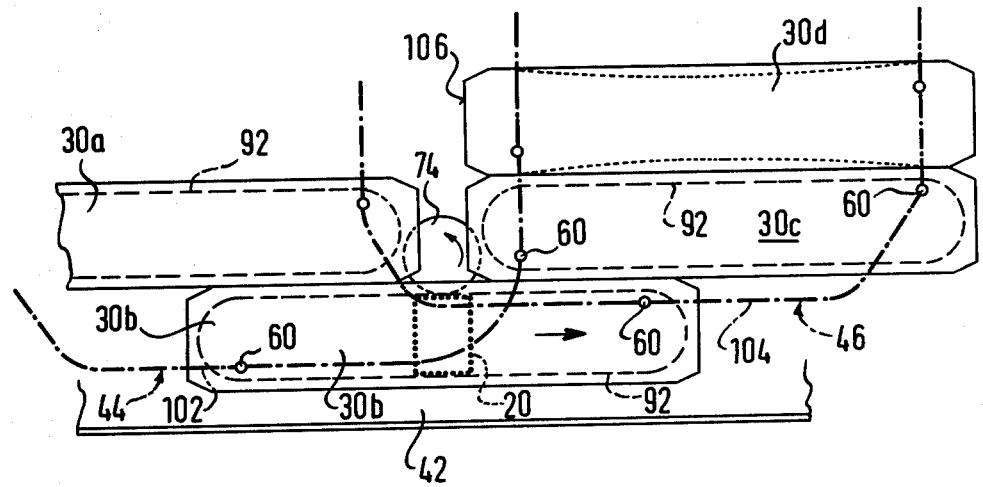

As can be seen from FIGS. 2 through 3C, the pallet 30 situated in the transition path 40 performs a linear movement during which it slides along the side surfaces of the pallets 30 of the two moving paths 38 which face it. Furthermore, at the end of the transition path 40, the pallet 30 is arranged inwardly offset relative to the pallets 30 of the following moving path 36. After subsequently passing through the rounded deflection path 39, the pallet 30 is displaced by exactly one width of a pallet relative to its position in the preceding transition path 40 and is now in alignment with the other pallets 30 in the moving path 38.

Figure 5:
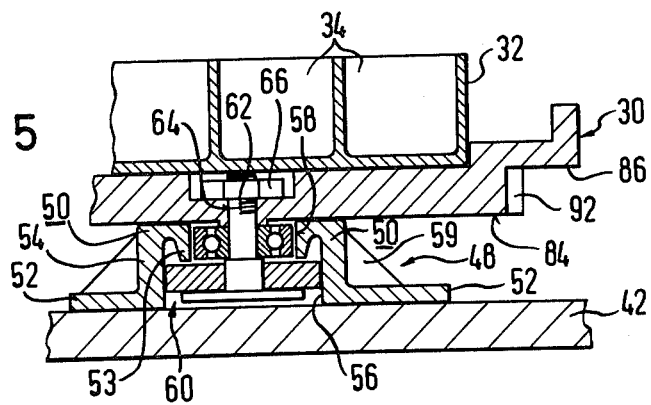
FIG. 5 is a sectional view of a detail taken along the line V—V in FIG. 2.
Figure 6:
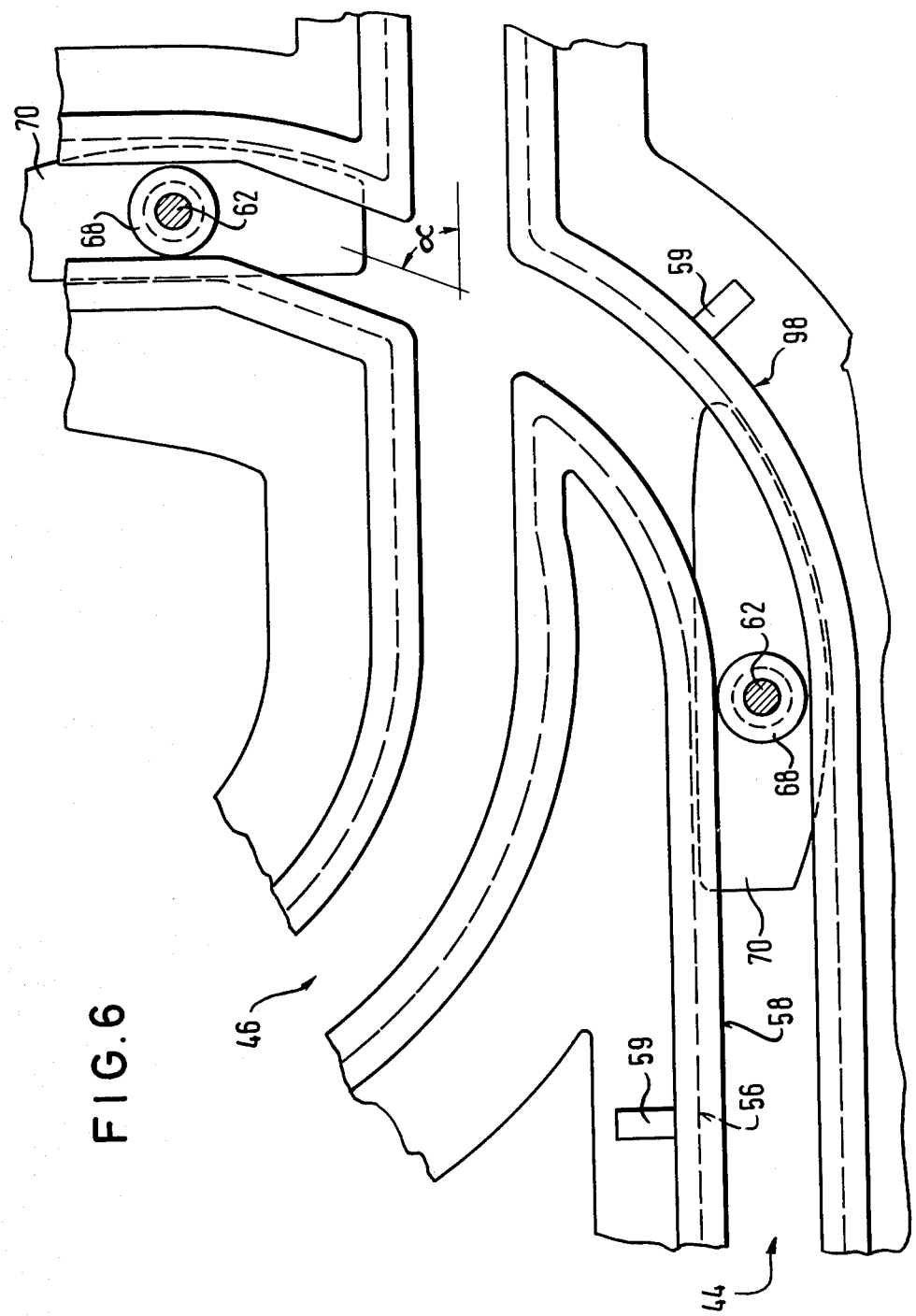
FIG. 6 show, on a larger scale, a top view of an intersection point of groove paths.

In order to guide the pallets along the looped path 36 and to effect a slight swiveling movement of the pallets 30 in the deflection paths 39 (the swiveling movement will be discussed below), two groove paths are provided on a plane base plate 42 of the assembly table 10. The groove paths are indicated in FIG. 2 with dash-dot lines, the groove path on the left being designated by reference numeral 44 and the groove path on the right being designated by reference numeral 46. Each groove path consists of a guide groove 48 whose shape is illustrated in FIGS. 5 and 6. Two angle elements 50 which are essentially L-shaped in the cross-section are arranged spaced from one another on the base plate 42, the horizontal sides 52 of the angle elements 50 facing away from one another. The free ends 53 of the vertical sides 54 are bent toward the respectively other angle 50 so as to form approximately a U-shaped ends. Accordingly, underneath the ends 53, an undercut guide groove 56 is formed between the angles 50 and a groove opening 58 is formed between the ends 53. For stiffening the angle 50, the latter are provided with sloped ribs 59 between the sides 50 and 52.

Figure 4:
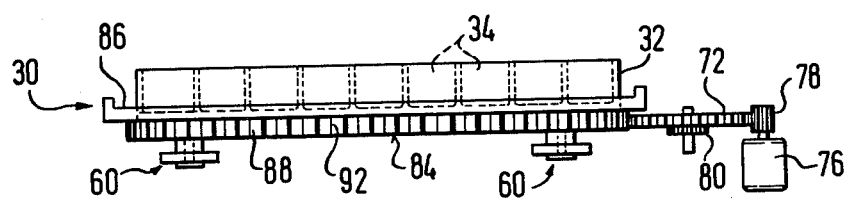
FIG. 4 is a side view of a pallet.

As can be seen from FIGS. 4 and 5, each pallet 30 carries on its underside two guide elements 60 which engage in the guide groove 48 of the groove path 44 or of the groove path 46. The guide elements 60 are each indicated with a small circle in FIG. 2.

In the case of intersecting groove paths, these exists the danger that the guide elements 60 enter the incorrect path. In order to reduce this danger, the groove paths 44 and 46, as shown in FIG. 2, are offset relative to one another in such a way that the groove paths 44 and 46 intersect at a relatively large angle α which is about 70° (see also FIG. 6).

The construction of a guide element 60 is illustrated in FIGS. 5 and 6. At the bottom side of the pallet 30, a guide roller 68 and a guide member 70 are mounted on a stepped support bolt 62 which is inserted into a pallet bore 64 and is rigidly connected to the palett 30 at is upper end by means of a nut 66. The guide roller 68 which is supported by a roller bearing engages into the already mentioned groove opening 58, the diameter of the guide roller 68 being slightly smaller than the width of the groove opening. This ensures a travel of the guide elements 60 in the guide grooves 48 with little friction. The guide member 70 which is also rotatably supported is illustrated in FIG. 6 in a top view on a larger scale. The guide member 70 is constructed in an oblong shape. The width of the guide member 70 is adapted to the width of the guide groove 56. To ensure that the guide member 70 does not jam in rounded portions of the groove paths 44 and 46, the guide member 70 is rounded on its side facing outwardly, i.e., on the side facing away from the center of the guide paths 44 and 46. In FIG. 6, two guide members 70 are illustrated, the position of the guide members 70 corresponding to the configuration of pallets illustrated in FIG. 2. In order to prevent a collision of the guide member 70 of the lowermost pallet 30 with the guide member 70 illustrated in the top right portion of FIG. 6 when this lowermost pallet 30 is moved toward the left, the guide members 70 are appropriately shortened at their ends.

The pallets 30 are driven by means of two gear wheels 72 and 74 which are mounted on the base plate 42 so as to be rotatable about vertical axes. One of the gear wheels, i.e., the upper gear wheel 72 as seen in FIG. 2, is rotated by means of a pinion 78 which is driven by a motor 76. In the schematic illustration of FIG. 4, an auxiliary gear wheel 80 is shown on the bottom side of the gear wheel 72, the auxiliary gear wheel 80 being connected to the latter for rotation therewith. A corresponding auxiliary gear wheel 80 is also mounted on the other gear wheel 74. A toothed belt 82, indicated in FIG. 2 with broken lines, ensures the synchronous movement of the two gear wheels 72 and 74.

The pallets 30 are each constructed with a base member 84 which carries, at its upper end, an outwardly cantilevered edge web 86. The base member 84 has two parallel vertical side surfaces 88 extending in the longitudinal direction of the base member 84 and two semi-cylindrical surfaces 90 connecting these surfaces 88 (see FIG. 2). Along it circumference, i.e., along the side surfaces 88 and the semi-cylindrical surfaces 90, the base member 84 is provided with a circumferential toothing intended for engagement in the teeth of the gear wheels 72 and 74. In FIGS. 2 and 3A through 3C, the circumferential toothing 92 is indicated in broken lines in some of the paletts 30 (the circumferential toothing 92 not being directly visible in these views).

In the following, the sequence of movements during the pallet transport is explained with the aid of FIGS. 2 through 3C. For this purpose, the pallets 30 are provided with the following reference numerals:

The pallet located in the lower moving path as seen in FIG. 2 is designated by reference numeral 30c; the pallets following counterclockwise are designed by reference numerals 30d and 30m and the two pallets preceding palett 30c counterclockwise are designated by reference numerals 30b and 30a. Due to the symmetry of the arrangement, the pallets located oppositely with respect to the loop center point X (for example, the paletts 30b and 30h, the pallets 30c and 30i and the pallets 30d and 30k) are in the same phase of movement. Accordingly, the sequence of movement of the pallets 30a through 30d described with the aid of FIGS. 3A through 3C corresponds to the movement of the oppositely located pallets 30g through 30k. The pallets are moved in the direction of the arrow A shown in FIG. 2, to wit, counterclockwise.

In the initial position illustrated in FIG. 2, the pallet 30c has just reached the end of its step-by-step movement along the lower transition path 40 and rests laterally against the pallet 30d at the lower end of the moving path 36 on the right as seen in FIG. 2. The position of this pallet 30d and of the other pallets 30e to 30h and 30k to 30b is called the normal position. In the normal position of the pallets in the moving paths, the two pallets 30c and 30i in the transition paths can be moved unimpaired back and forth along the transition path 40, however, they rest laterally against the adjacent pallets in the transition paths. This movement is effected by the two gear wheels 72 and 74 which engage the circumferential toothings 92 of the two pallets. The circumferential toothings 92 of the adjacent pallets 30b and 30d or 30h and 30k are disengaged from the gear wheels 74 or 72.

When the upper gear wheel 72 driven by the pinion 78 is turned in the direction of the arrow B after an appropriate component has been taken from the compartment 34 located underneath the removal opening 20, the gear wheel 74 coupled to the gear wheel 72 over the toothed belt 82 also rotates in the same direction, which leads to the result that the pallet 30c (as well as the corresponding pallet 30i) is moved further toward the right in the direction of arrow C, so that it is now located in the deflection path 39. In doing so, the guide element 60 arranged at the inner end of the pallel 30c reaches a rounded corner portion 98 of the groove path 44, while the other guide element 60 enters a corner portion 95 of the groove path 46 which is comparatively more sharply angled and extends in a straight line. Accordingly, the outer end of the pallet 30c remote from the gear wheel 74 performs a slight swiveling movement in the counterclockwise direction. The pallet 30d as well as the paletts 30i to 30h following in the right moving path 38 are also swiveled in the same manner. The teeth of the gear wheel 74 then no longer enggage in that portion of the circumferential toothing 92 formed on the inwardly located side surface 88, but in the subsequent toothing portion formed on the semicylindrical surface 90. Upon a further rotation of the gear wheel 74, also the end of the pallet 30c which is near the gear wheel 74 is raised and so are the pallets 30d to 30h. In doing so, the uppermost pallet 30h is pushed into the next following deflection path 39 and then soon reaches an engagement position in which the gear wheel 72 engages the circumferential toothing 92 of this pallet 30h. During this time, however, the pallet 30c remains in engagement with the gear wheel 74 because it reaches its disengagement position later in the sequence of movement. Since, with respect to the sequence of movement, the pallet 30i corresponds to the pallet 30c and the pallet 30b corresponds to the palett 30h, the gear wheel 74 is now in engagement with the pallets 30c and 30b and, in the same manner, the gear wheel 72 is in engagemeent with the pallets 30h and 30i.

FIG. 3A shows an instance in which the pallet 30b is already fully engaged with the gear wheel 74 and is swiveled downwardly to the right by the latter. The gear wheel 74 is still in full engagement with the pallet 30c. A further rotation of the gear wheel 74 results in the situation illustrated in FIG. 3B in which the pallet 30c is in the position immediately preceding the disengagement from the wheel 74 (disengagement position). In this position, immediately after the disengagement, there is the danger of an incorrect meshing of the teeth when, due to a sudden vibration or a reversal of the direction of the drive, the pallet no longer driven by the gear wheel 74 moves back toward the gear wheel 74. This danger is eliminated by pushing the pallet 30c ahead by the immediately subsequent pallet 30b; this is done already at a point in time at which there is still a secure engagement between the teeth of the gear wheel 74 and the toothing of the pallet 30c. Serving for a quick removal of the pushed-ahead pallet 30c from the gear wheel 74 is an appropriately slanted, straight-lined portion 100 of the corner portion 98 of the groove path 44. As can be seen from FIG. 3B, the guide element 60 of the pallet 30c which is closer to the gear wheel 74 is just in this portion 100 when the pallet 30c is in the region of its disengagement position. In accordance with the inclination of the portion 100, the pallet 30c is pushed quickly away from the gear wheel 74 by the subsequent pallet 30b. If a reversal of the direction of the pallet 30c which has just been disengaged takes place, there is also no danger of an uncontrolled meeting of the gear wheel 74 and the toothing of the pallet 30c. In the case of a reversal of the direction, the pallet 30h (see FIG. 2) which is already in engagement with the gear wheel 72 is moved downwardly by this gear wheel and so is the pallet 30c by the pallets 30d to 30g arranged therebetween. However, the pallet 30b runs ahead of the pallet 30c with a slight play only to such an extent that a premature meshing of the toothing is reliably prevented.

Figure 3B:
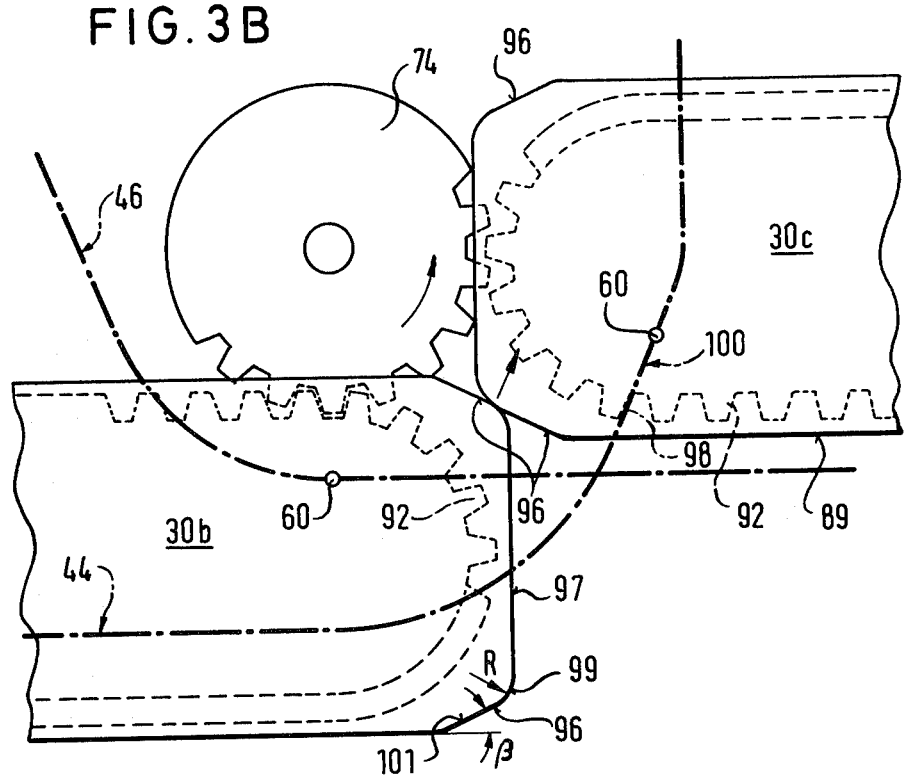

In order to facilitate the mutual pushing of the pallets and to keep the wear low, the pallet corner regions are beveled in the manner illustrated in FIG. 3B. Each pallet end surface 97 is followed on both corners by a rounded portion 99. These portions 99 continue each into a beveled portion 101, the beveled portions 101 including an angle $\beta$ with the respectively adjacent pallet side surfaces 89. Initially, successive pallets 30b and 30c have contact with the rounded portions; subsequently, the beveled portions 101 slide on one another which leads to the desired shifting of the pallet 30c from the disengagement position illustrated in FIG. 3B into the normal position according to FIG. 3C at the lower end of the subsequent moving path 38.

In the meantime, the pallet 30b has reached the transition path 40 and can now be moved underneath the removal opening 20 further toward the right in accordance with the division into compartments in the longitudinal direction of pallet. When this is done, there exists the possibility that the right end of this pallet 30b pushes the outer end of the pallet 30c upwardly into the normal position, the outer end of the pallet 30c possibly not having yet swiveled far enough upwardly. In order to facilitate this, the pallets 30 can be provided with a slight waist (dotted circumference line of the pallet 30d in FIG. 3C), so that the moments at the beginning of the shifting movement of the pallets 30b in the transition path 40 are kept low. Accordingly, the outer end of the pallet 30c and the appropriate ends of the pallets 30d to 30g preceding the pallet 30c in the moving path 38 are swiveled upwardly in two steps. In a first step at the beginning of the movement of the pallet 30c, the outer end runs ahead of the inner end; this is due to the comparatively greater inclination (corner portion 95) of the groove path 46 assigned to the guide element 60 at the outer pallet end. After the inner end has been disengaged, the outer end which has in the meantime been overtaken by the inner end is then pushed upwardly by the subsequent pallet in the second step. In a modified embodiment of the invention, one of the two steps can be omitted if the swiveling movement achieved by the other step is sufficiently large.

Figure 7:
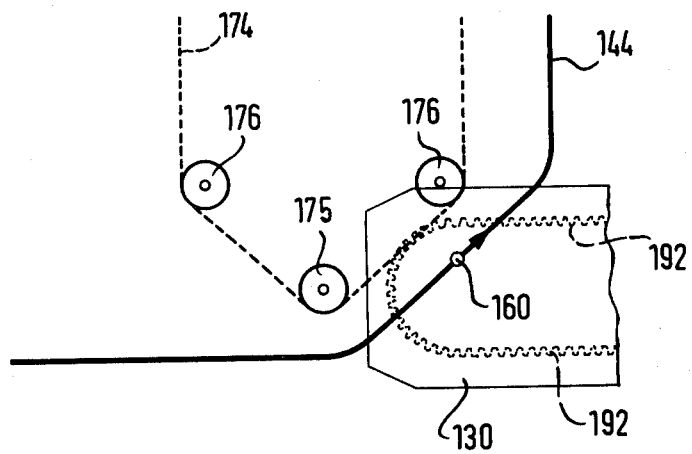
FIG. 7 is a schematic top view of a pallet chain drive.

FIG. 7 schematically shows a further embodiment of a feed mechanism for parts. In this embodiment, a chain 174 is provided instead of the two gear wheels 74 and 76. This chain 174 acts on a circumferential toothing 192 of a pallet 130 adapted to this chain. In its lower portion illustrated in FIG. 7 (which corresponds to the upper portion), the chain 174 is guided around a middle deflection roller 175 and two lateral deflection rollers 176. In the illustrated arrangement, the pallet 130 has just reached a deflection path. When it is subsequently moved in the direction of the arrow, the increasing distance between the chain 174 and the groove path 144 causes the circumferential toothing to lose contact with the chain 174 prior to reaching the moving path. In all other respects, the operation principle of the feed mechanism according to FIG. 7 corresponds to that of the feed mechanism described hereinabove with the aid of FIGS. 1 through 6.

Instead of the chain 174 acting on the pallets on their inner sides as shown in FIG. 7, it is also possible to provide a chain which is guided around the pallets on the outside and which acts on the outer sides of the pallets. Moreover, the projection 84 carrying the circumferential toothing 92 can also be replaced by a row of vertical pins which extends in the longitudinal direction of the pallet, wherein the pins can be engaged by gear wheels which correspond to the gear wheels 72 and 74.

I claim:

1. Feed mechanism for parts, particularly for an assembly table for printed circuit boards, comprising a plurality of oblong pallets provided with vessels for receiving parts, a guide system conducting said pallets along a looped path, said pallets being arranged essentially parallel to one another, said looped path including two moving paths located parallel next to one another and extending approximately perpendicular to the longitudinal direction of said pallets, and two transition paths connecting said two moving paths, a drive for moving said pallets along said looped path, said drive having a drive element each in the region of said two transition paths, each said drive element acting on a first engagement means of the respective pallet located in said transition path, wherein several pallets are arranged in each moving path with mutual lateral contacts and are moved jointly step-by-step by the width of one pallet, while the pallets of the respectively other moving path are moved in the opposite direction, and wherein a pallet can be moved step-by-step in each transition path by means of the respective drive element, while the pallet in the respectively other transition path is moved in the opposite direction and the pallets located in said moving paths stand still in the normal position, wherein a pallet located at the end of a transition path laterally rests against the next following pallet in the subsequent moving path, and wherein four slanting or rounded deflection paths are provided in said looped path each deflection path connecting one of said moving paths with one of said transition paths, said pallets are provided with second engagement means for engagement with each drive element during movement of said pallets along said deflection paths from an engagement position on each of said deflection paths to the beginning of the next following transition path respectively and from the end of said transition paths to a disengagement position on said next following deflection path respectively, and wherein said engagement and disengagement positions on each of said deflection paths are displaced relative to the next lying transition path towards the respective other transition path by a non-vanishing distance being less than the width of a pallet.

2. Feed mechanism according to claim 1, characterized in that the distance of displacement seen in the direction of the pallet width of a pallet moved from a transition path into one of the disengagement positions is greater than the distance of displacement seen in the direction of the pallet moved from a normal position at the end of a moving path into one of the engagement positions.

3. Feed mechanism according to claim 1, characterized in that the end regions of at least one of said pallets and said deflection paths are constructed in such a way that, when a pallet immediately approaches an engagement position in the direction toward the closest position path, said pallet rests against one of the preceding pallet driven by the closest drive element over slanting pallet corner regions of both pallets and follows the preceding pallet with a slight distance play, so that an unintended movement of the subsequent pallet into the engagement position is prevented by the preceding pallet.

4. Feed mechanism according to claim 1, characterized in that at least one of the end regions of said pallets and said deflection paths are constructed in such a way that, when a pallet is moved along a deflection path toward the following moving path, at the latest after reaching the disengagement position, the subsequent pallet begins to push the preceding pallet into the next following normal position over slanting pallet corner regions of both pallets.

5. Feed mechanism according to one of claims 3 and 4, characterized in that said pallet corner region is formed by a slanting portion which starts at the pallet side surface and continues into the pallet end surface over a rounded portion.

6. Feed mechanism according to claim 1, characterized in that said disengagement position is essentially identical to said engagement position and is located closer to said moving path than to said transition path, as seen in the direction of the pallet width.

7. Feed mechanism according to claim 1, characterized in that said pallets are each constructed with an oblong drive projection extending in the longitudinal direction of the pallet and having an engagement surface for said drive elements extending in the plane of said moving path, and that, upon a movement of said pallets along said transition path, said drive element arranged in the region of the middle of the length of the respective transition path essentially roll on that side surface of said drive projection which faces the center point of said looped path.

8. Feed mechanism according to claim 7, characterized in that said drive projection is constructed with a circumferential toothing which formed of two parallel, essentially straight longitudinal toothings and two end toothings as said second engagement means which connect said longitudinal toothings and one of describe a semicurcular arc and form an acute angle.

9. Feed mechanism according to claim 7, characterized in that said drive projection is formed by a row of pins as said first engagement means, with the last pin at botth ends of the row as second engagement means.

10. Feed mechanism according to claim 1, characterized in that said two drive elements are formed by one of a chain and toothed belts which are guided around deflection rollers in the region of the middle of the length of said transition paths.

11. Feed mechanism according to claim 1, characterized in that said two drive elements are formed by synchronously driven gear wheels 12. Feed mechanism according to claim 1, wherein said pallets rest on an essentially plane base, characterized in that two loop-shaped groove paths are provided at said base, said loop-shaped groove paths arranged offset relative to one another and each constructed with a guide groove whose respective shapes each correspond essentially to the shape of said looped path, and that said pallets are each provided with two guide elements which each engage in a guide groove assigned to it.

13. Feed machanism according to claim 12, characterized in that said guide grooves intersect at an angle α of such a magnitude that an engagement of one guide element into the guide groove of one guide element into the guide groove assigned to the other guide element is essentially excluded during operation.

14. Feed mechanism according to claims 12, characterized in that each said guide element has a pivotable, oblong guide member which is inserted into said guide groove.

15. Feed mechanism according to claim 12, characterized in that said guide grooves are undercut.

16. Feed mechanism according to claim 12, characterized in that said guide elements are constructed with rotatably mounted guide rollers whose diameter is slightly smaller than the width of said guide groove or the groove opening of said undercut guide groove, and that said guide rollers engage in said guide groove or said groove opening.

17. Feed mechanism according to claim 1, characterized in that said pallets are guided along said deflection paths in such a way that, at the beginning of a shifting movement of a pallet in deflection path from a transition path to a moving path, the pallet end more remote from said drive element performs a swivelling movement toward said moving path.

18. Feed mechanism according to claim 1, characterized in that, at the end of a shifting movement of a pallet in a deflection path from a transition path to a moving path, the front end of said pallet, i.e. the front end during travel, is swivelled by the subsequent pallet toward said moving path into the normal position.

19. Feed mechanism according to claim 18, characterized in that said oblong pallets are provided with a waist.

20. Feed mechanism according to claim 1, characterized in that said deflection paths are slanted in the regions of said engagement positions and said disengagement positions in such a way that the pallet ends located closes to said drive elements quickly engage with or disengage from said drive elements.

21. Feed mechanism according to claim 1, wherein said pallets are provided with a circumferential toothing which is formed of two parallel essentially straight longitudinal toothings as first engagement means and two end toothings are second engagement means which connect said longitudinal toothings and one of describe a semicircular arc and form an acute angle.

22. Feed mechanism according to claim 1, wherein said pallets are provided with a row of pins extending parallel to the longitudinal direction of said pallets as first engagement means, with the last pin at both ends of the row as second engagement means.

23. Feed mechanism according to claim 1, wherein the total sum of pallets is an even number and wherein the pallets located oppositely with respect to a loop center point are in the same phase of movement.

* * * * *